(12) United States Patent
Kamiyama

(10) Patent No.: US 6,731,549 B2
(45) Date of Patent: May 4, 2004

(54) SEMICONDUCTOR MEMORY DEVICE

(75) Inventor: Koichi Kamiyama, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 22 days.

(21) Appl. No.: 10/179,801

(22) Filed: Jun. 24, 2002

(65) Prior Publication Data
US 2002/0196674 A1 Dec. 26, 2002

(30) Foreign Application Priority Data
Jun. 26, 2001 (JP) ........................................ 2001-192713

(51) Int. Cl.$^7$ ................................................. G11C 7/00
(52) U.S. Cl. ............. 365/194; 365/230.06; 365/230.08; 365/233.05
(58) Field of Search ............................ 365/194, 230.06, 365/230.08, 233.05

(56) References Cited

U.S. PATENT DOCUMENTS

| 5,228,003 A | 7/1993 | Tokuda |
| 5,493,537 A | 2/1996 | McClure |
| 5,940,337 A | 8/1999 | Jiang |
| 5,986,970 A | 11/1999 | Hunt et al. |
| 6,154,417 A * | 11/2000 | Kim .......................... 365/233 |
| 2002/0191466 A1 * | 12/2002 | Hwang et al. ............... 365/222 |

FOREIGN PATENT DOCUMENTS

JP   06-176575   6/1994

OTHER PUBLICATIONS

Communication from the European Patent Office mailed on Sep. 25, 2003, for patent application No. EP 02 254 461. 3 pages.

* cited by examiner

Primary Examiner—Hoai Ho
Assistant Examiner—Long Tran
(74) Attorney, Agent, or Firm—Morrison & Foerster LLP

(57) ABSTRACT

A semiconductor memory device includes a memory cell provided at each of intersections of word lines and bit lines and connected to the corresponding word line and the corresponding bit line; an address transition detection circuit; an address latch circuit; an address decoder; a pre-charging circuit; and a control signal generation circuit. The address latch circuit is controlled by a bit line pre-charging signal, such that while the bit line pre-charging signal is at a first logic level, the address signal is input to the address latch circuit, and while the bit line pre-charging signal is at a second logic level, the input address signal is maintained by the address latch circuit. The address decoder is activated by the decoder activating signal. The address decoder is activated, the word line corresponding to the address signal is activated, and the memory cell connected to the corresponding word line is accessed.

7 Claims, 5 Drawing Sheets

PRIOR ART

SEMICONDUCTOR MEMORY DEVICE

BACKGROUND OF THE INVENTION

1. Field of the Invention

The present invention relates to a semiconductor memory device, such as, for example, an SRAM (static random access memory).

2. Description of the Related Art

Most recent semiconductor integrated circuits receive an input signal through an input end thereof in an asynchronous state which does not depend on a clock signal, and execute an operation in response to the input signal at a relatively high frequency on the order of several tens of megahertz. A known example of such a semiconductor device is a semiconductor memory device referred to as an SRAM.

An SRAM includes a plurality of memory cells. The SRAM receives an address signal through an address end thereof and statically accesses a memory cell corresponding to the value of the received address signal so as to perform a read or write operation. Such an operation of the SRAM does not depend on a clock signal which indicates that the value of the address signal input to the address end is valid. Therefore, the read or write operation can be performed rapidly in response to the input address signal.

In the SRAM having the above-described structure, the timing at which the address signal is supplied may widely vary. In one example, after a series of address signals are supplied sequentially from the address end to the SRAM at a high speed of, for example, 20 MHz, a state of the signal which is input from the address end does not change for a relatively long time period. In a conventional SRAM in which a memory cell is accessed completely statically, the access to the memory cell selected in accordance with the value of the address signal supplied to the address end is maintained during the time period in which the state of the address signal does not change, unless the SRAM is controlled by another method using, for example, a chip select signal or an output enable signal.

In order to reduce an amount of power required for the relatively long time period in which the value of the address signal does not change (hereinafter, referred to as a "timeout period") and improve an internal dynamic operating performance, most of the recent SRAMs include an address transition detection (ATD) circuit.

The ATD circuit detects a state transition of the signal which is input to an input end, especially an address end, of the SRAM, and generates an internal control signal in response to the detection of the state transition. The SRAM uses the ATD circuit in order to generate the internal control signal after the state transition of the address signal supplied to the SRAM is detected and before an address decoder accesses a desired memory cell. Thus, the SRAM can perform an internal operation such as, for example, a precharging operation of a bit line, and activation and deactivation of a sense amplifier. Such an internal operation may alternatively be performed after a prescribed timeout period passes in a cycle in which a memory cell is accessed (access cycle). When a new address signal is supplied to the SRAM, the ATD circuit detects a state transition of the address signal which is input to the address end and generates an internal control signal. Thus, the components of the SRAM which are necessary for the internal operations are activated, and a memory cell corresponding to the value of the new address signal is accessed.

When an address signal including a state transition at, for example, a high frequency is supplied to an SRAM or the like including the ATD circuit, a plurality of word lines in a memory array are undesirably selected and activated simultaneously regardless of whether the state transition is performed intentionally or occurs due to noise. This may undesirably result in that data stored in a memory cell of the SRAM is destroyed or a high level of current causes damage in the SRAM. In order to prevent the plurality of word lines from being simultaneously activated, it has been proposed that all the word lines be forcibly placed into an of f state (inactive state) during a time period in which the operation is in an equilibrium state in, for example, a second half of the access cycle. However, this conventional technique involves an undesirable possibility that a state transition of the address signal occurs before all the word lines are forcibly placed into the off state in the case where an input buffer circuit, provided for buffering the address signal supplied to the SRAM or other types of semiconductor memory devices, has a sufficiently high response speed. Therefore, this technique is not effective for preventing the plurality of the word lines from being simultaneously activated.

In order to solve these problems, Japanese Laid-Open Publication No. 6-176575, for example, discloses an input buffer circuit as shown in FIG. 4. The input buffer circuit shown in FIG. 4 is provided to each address end for receiving an address signal supplied to the SRAM or other types of semiconductor memory devices. The input buffer circuit includes an input stage 110, a delay circuit 116, a bus gate 118, an ATD circuit 120, and a latch 130.

The input stage 110 includes a terminal A for receiving an address signal, a terminal CE_ for receiving a chip enable signal, two P-channel pull-up transistors 112a and 112b, and two N-channel pull-down transistors 114a and 114b. A gate of one of the P-channel pull-up transistors 112a and a gate of one of the N-channel pull-down transistors 114a receive an address signal A1 (FIG. 5) from the terminal A. A gate of the other P-channel pull-up transistor 112b and a gate of the other N-channel pull-down transistor 114b receive a chip enable signal from the terminal CE_. An output end of the input stage 110 is connected to the delay circuit 116 and the ATD circuit 120 via inverters 113 and 115. The delay circuit 116 and the ATD circuit 120 each receive a signal B_ (FIG. 5) which is obtained by inverting the logic level of the address signal A1.

The delay circuit 116 outputs the signal B_ after a prescribed delay time period. An output end of the delay circuit 116 is connected to the bus gate 118 via an inverter 117, and the bus gate 118 receives a signal AD (FIG. 5) which is obtained by inverting the logic level of the signal B_ with a prescribed delay time period.

The ATD circuit 120 includes a delay gate 124a for directly receiving the signal B_ and a delay gate 124b for receiving the signal B_ via an inverter 123. The signal output from the delay gate 124a is input to one of two input terminals of a delay gate 126a. The signal output from the delay gate 126a is input to one of two input terminals of a delay gate 126b. The signal output from the delay gate 126b is input to one of two input terminals of a delay gate 126c. The other input end of the delay gate 126a, the other input end of the delay gate 126b, and the other input end of the delay gate 126c each receive the signal B_ via the inverter 123 and another inverter 125.

The signal output from the delay gate 126c via an inverter 129a (signal BD) is sent to one of two input terminals of a NAND gate 122a. As shown in FIG. 5, the signal BD is obtained by inverting the logic level of the signal B__. Specifically, a starting point of a pulse (falling edge) of the signal BD is delayed with respect to a starting point of a pulse (rising edge) of the signal B__ by a time period $t_d$.

Returning to FIG. 4, the other input end of the NAND gate 122a receives the signal B__ which is input to the ATD circuit 120. The signal output from the NAND gate 122a (signal P__) is sent to one of two input terminals of a NAND gate 128. As shown in FIG. 5, the signal P__ is kept in an inactive state for the time period $t_d$ when both the signals B__ and BD are in an active state.

Referring to FIG. 4, the signal output from the delay gate 124b is input to one of two input terminals of a delay gate 126d. The signal output from the delay gate 126d is input to one of two input terminals of a delay gate 126e. The signal output from the delay gate 126e is input to one of two input terminals of a delay gate 126f. The other input end of the delay gate 126d, the other input end of the delay gate 126e, and the other input end of the delay gate 126f each receive the signal B, via the inverter 123, which is obtained by inverting the logic level of the signal B__.

The signal output from the delay gate 126f via the inverter 129b (signal BD__) is sent to one of two input terminals of a NAND gate 122b. As shown in FIG. 5, the signal BD__ is obtained by inverting the logic level of the signal B__. Specifically, a termination point of a pulse (falling edge) of the signal BD__ is delayed with respect to a termination point of a pulse of the signal B__ by the time period $t_d$.

The other input end of the NAND gate 122b receives the signal B. The signal output from the NAND gate 122b (signal P) is sent to the other input end of the NAND gate 128. As shown in FIG. 5, the signal P is kept in an inactive state for a time period in which both the signals B and BD__, which are input to the NAND gate 122b, are in an active state. Thus, a pulse signal ATD which is at a HIGH logic level during a prescribed time period is output from the NAND gate 128 in response to the state transition of the address signal A1 which is input to the input buffer circuit.

The bus gate 118 includes a P-channel transistor and an N-channel transistor which are connected in parallel. A gate of the P-channel transistor directly receives the pulse signal ATD from the ATD circuit 120, and a gate of the N-channel transistor receives the inverted pulse signal ATD via an inverter 121. The bus gate 118 is controlled by the pulse signal ATD output from the ATD circuit 120, and the bus gate is shielded from the latch 130 while the pulse signal ATD is output. An output end of the bus gate 118 is connected to the latch 130.

The latch 130 includes two inverters, i.e., a first inverter and a second inverter connected in a loop branch across the first inverter. An output of the latch 130 is connected to an output terminal $A_{OUT}$ of the input buffer circuit via an inverter 131. The output terminal $A_{OUT}$ is connected to an internal circuit (not shown) of the SRAM or other types of semiconductor memory devices.

An operation of the input buffer circuit will be described with reference to FIG. 5. FIG. 5 is a timing diagram illustrating waveforms of various signals input and output by various components in the input buffer circuit shown in FIG. 4.

During a time period from $t_2$ to $t_4$, the pulse signal ATD is output from the ATD circuit 120 and thus the bus gate 118 is shielded. Therefore, the latch 130 maintains the signal AD which is input for a time period from $t_0$ to $t_1$ before the state transition of the address signal A1 occurs. Thus, a signal $A1_{OUT}$, which is in the same state as the signal before the state transition of the address signal, is output to the internal circuit. When the time period in which the pulse signal ATD is at a HIGH logic level is terminated at time $t_4$, a new post-state transition signal AD is supplied from the bus gate 118 to the latch 130. A post-state transition signal $A1_{OUT}$ is output to the internal circuit, such as, for example, an address decoder, a pre-charging circuit, or a memory cell.

During a time period from $t_5$ to $t_{10}$, since the pulse signal ATD is output from the ATD circuit 120, the bus gate 118 is shielded. Therefore, even when an accidental state transition of the address signal A1 occurs as does during a time period from $t_7$ to $t_9$, the signal AD is not input to the latch 130, and the latch 130 outputs a signal maintaining the previous state. Accordingly, such a short, accidental state transition can be prevented from influencing the signal which is output from the input buffer circuit. In FIG. 5, the dashed lines shown regarding the signal BD__ and the signal ATD represent the level which is obtained when the address signal output from the terminal A is at a HIGH logic level until the end of the delay time period $t_d$.

In the case where the input buffer circuit having the above-described structure is used for a general, conventional SRAM, the following phenomenon occurs. While the pulse signal ATD is at a HIGH logic level, the post-state transition address signal is not input to the address decoder, and the pre-state transition address signal which is maintained in the latch 130 is input to the address decoder and then decoded. During the time period in which the pulse signal ATD is at a HIGH logic level, an internal operation control signal which is generated based on the pulse signal ATD places the word line selected in an immediately previous access cycle into a non-selected state. After the pulse signal ATD becomes LOW, a new address signal is input to the address decoder and decoded, and a word line corresponding to the value of the new address signal is selected. As a result, even when a short, accidental state transition occurs to the address signal which is input to the input buffer circuit, the plurality of word lines can be prevented from being simultaneously activated as described above.

However, the technology described in Japanese Laid-Open Publication No. 6-176575 has the following problems.

The delay time period realized by the delay circuit 116 is set such that the state transition of the address signal A1 which is input to the terminal A does not reach the bus gate 118 before the bus gate 118 is shielded by the pulse signal ATD output from the ATD circuit 120. The pulse output from the ATD circuit 120 is delayed with respect to the state transition of the address signal A1 input to the terminal A by the delay time periods provided by the delay gates 124a, 124b, 126a, 126b, 126c, 126d, 126e and 126f. The delay time period realized by the delay circuit 116 is set as described above in order to prevent generation of race or competition conditions between the signal output from the delay circuit 116 and the signal output from the ATD circuit 120. In order for the state transition of the signal AD (FIG. 5) not to occur before the pulse signal ATD becomes HIGH, the time period from time $t_2$ to $t_3$ is adjusted by the delay circuit 116. The race or competition conditions cause an inappropriate operation of activating a plurality of word lines in a memory array.

When the pulse signal ATD becomes LOW, the new address signal is decoded by the address decoder. The timing of decoding needs to have a sufficient margin with respect to the internal operation of, for example, deactivating the word line corresponding to the value of the address signal which is input in the immediately previous access cycle, or stopping of the sense amplifier. In order to determine the timing of decoding, the race conditions between the time at which the pulse signal ATD becomes LOW and the time at which the internal operation is completed also need to be considered.

As described above, the conventional semiconductor memory device requires the following race conditions to be considered: (i) the race conditions between the time when the pulse signal ATD becomes HIGH and the time when the state transition of the signal AD output from the delay circuit 116 occurs, and (ii) the race conditions between the time when the pulse signal ATD becomes LOW and the time when the internal operation is completed. Such restriction regarding timings may undesirably influence the operating speed of the semiconductor memory device.

SUMMARY OF THE INVENTION

A semiconductor memory device according to the present invention includes a plurality of word lines and a plurality of bit lines arranged so as to cross each other; a memory cell provided at each of intersections of the plurality of word lines and the plurality of bit lines and connected to the corresponding word line, among the plurality of word lines, and the corresponding bit line, among the plurality of bit lines; an address transition detection circuit for detecting a state transition of an input address signal and generating a transition detection pulse signal; an address latch circuit for receiving the address signal and maintaining a value of the address signal; an address decoder for decoding the value of the address signal output from the address latch circuit, and selecting a word line corresponding to the value of the address signal among the plurality of word lines, and activating the selected word line; a pre-charging circuit for charging a bit line corresponding to the selected word line and the memory cell, among the plurality of bit lines; and a control signal generation circuit for receiving the transition detection pulse signal, and generating a decoder activating signal for activating the address decoder and a bit line pre-charging signal for controlling the pre-charging circuit. The address latch circuit is controlled by the bit line pre-charging signal, such that while the bit line pre-charging signal is at a first logic level, the address signal is input to the address latch circuit, and while the bit line pre-charging signal is at a second logic level, the input address signal is maintained by the address latch circuit. The address decoder is controlled to be activated by the decoder activating signal; and when the address decoder is activated, the word line corresponding to the value of the address signal input to the address decoder from the address latch circuit is activated, and the memory cell connected to the corresponding word line is accessed.

In one embodiment of the invention, the control signal generation circuit includes a first delay circuit, a second delay circuit, a third delay circuit, and a logic circuit. The first delay circuit receives the transition detection pulse signal, and outputs a signal having a termination point which is delayed with respect to the termination point of the transition detection pulse signal by a first delay time period. The second delay circuit receives the transition detection pulse signal, and outputs a signal having a termination point which is delayed with respect to the termination point of the signal output from the first delay circuit by a second delay time period. The third delay circuit receives the signal output from the first delay circuit, and outputs a signal, having a starting point which is delayed with respect to the starting point of the signal output from the first delay circuit by a third delay time period, as the bit line pre-charging signal.

The logic circuit receives the transition detection pulse signal and also receives the signal output from the second delay circuit, and outputs the signal which is received from the second delay circuit as the decoder activating signal during a time period in which the transition detection pulse signal is in an inactive state.

In one embodiment of the invention, the first delay circuit, the second delay circuit, the third delay circuit and the logic circuit are timed to operate such that the bit line pre-charging signal is activated in the third delay time period after the decoder activating signal, which is output from the control signal generation circuit, is placed into an inactive state, and such that the decoder activating signal is placed into an inactive state while the transition detection pulse signal is in an active state.

In one embodiment of the invention, the third delay time period is set to be equal to or greater than a shortest possible time period between the time when an immediately previous access is terminated and thus the selected word line is placed into an inactive state and the time when a pre-charging operation of the bit line is started for a subsequent access in the case where the memory cells are continuously accessed after the address signal is input.

In one embodiment of the invention, the third delay time period is set to be equal to or greater than a shortest possible time period between the time when an immediately previous access is terminated and thus the selected word line is placed into an inactive state and the time when a pre-charging operation of the bit line is started for a subsequent access in the case where the memory cells are continuously accessed after the address signal is input.

In one embodiment of the invention, the first delay time period is set to be a time period which is required for the bit line pre-charging signal, generated based on the detection of a transition of the pulse signal, to have a pulse time period which is equal to or greater than a pre-charging time period required to perform the subsequent access to the memory cells.

In one embodiment of the invention, the second delay time period is set to be equal to or greater than a shortest possible time period between the time when the pre-charging operation of the bit line is completed and the time when the activation of the word line is started.

According to a general semiconductor memory device such as, for example, an SRAM, an internal operation control signal is generated based on an ATD pulse signal which is output from an ATD circuit. The internal operation control signal controls an internal operation such as, for example, a pre-charging operation of the bit line, the deactivation operation of the word lines, or the activation and deactivation of the sense amplifier. In order to prevent a plurality of word lines from being simultaneously selected and activated when the state transition of the address signal occurs, the timing at which the logic level of an internal operation control signal changes is adjusted by a delay circuit or the like to be independent from and not directly synchronized with the internal operation. Accordingly, in the conventional semiconductor memory device, the following race conditions, for example, need to be considered: (i) the race conditions between the starting point of the time period in which the ATD pulse signal is at a HIGH level and the time when the state transition of the signal AD output from the delay circuit occurs, and (ii) the race conditions between the termination point of the time period in which the ATD pulse signal is at a HIGH logic level and the time when the internal operation is completed. Thus, the conventional semiconductor memory device needs to be designed with a sufficient margin for variance in the characteristics caused by dispersion in the production process or the like.

According to the present invention, the bit line pre-charging signal, which is an internal operation control signal, controls the input of the address signal to the address latch circuit and maintenance of the address signal by the address latch circuit. The decoder activating signal controls the activation of the address decoder. Therefore, the timing at which the post-state transition address signal is decoded by the address decoder can be synchronized with the timing of the internal operation. Accordingly, the plurality of word lines can be prevented from being simultaneously activated, and the address signal can be supplied to the address decoder within a time period which is usually required for an internal operation, without considering the above-mentioned race conditions. Thus, the margin, which may undesirably influence the operating speed of the entirety of the semiconductor memory device, need not be provided.

Thus, the invention described herein makes possible the advantages of providing a semiconductor memory device capable of preventing a plurality of word lines from being simultaneously selected without influencing the operating speed of the semiconductor memory device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
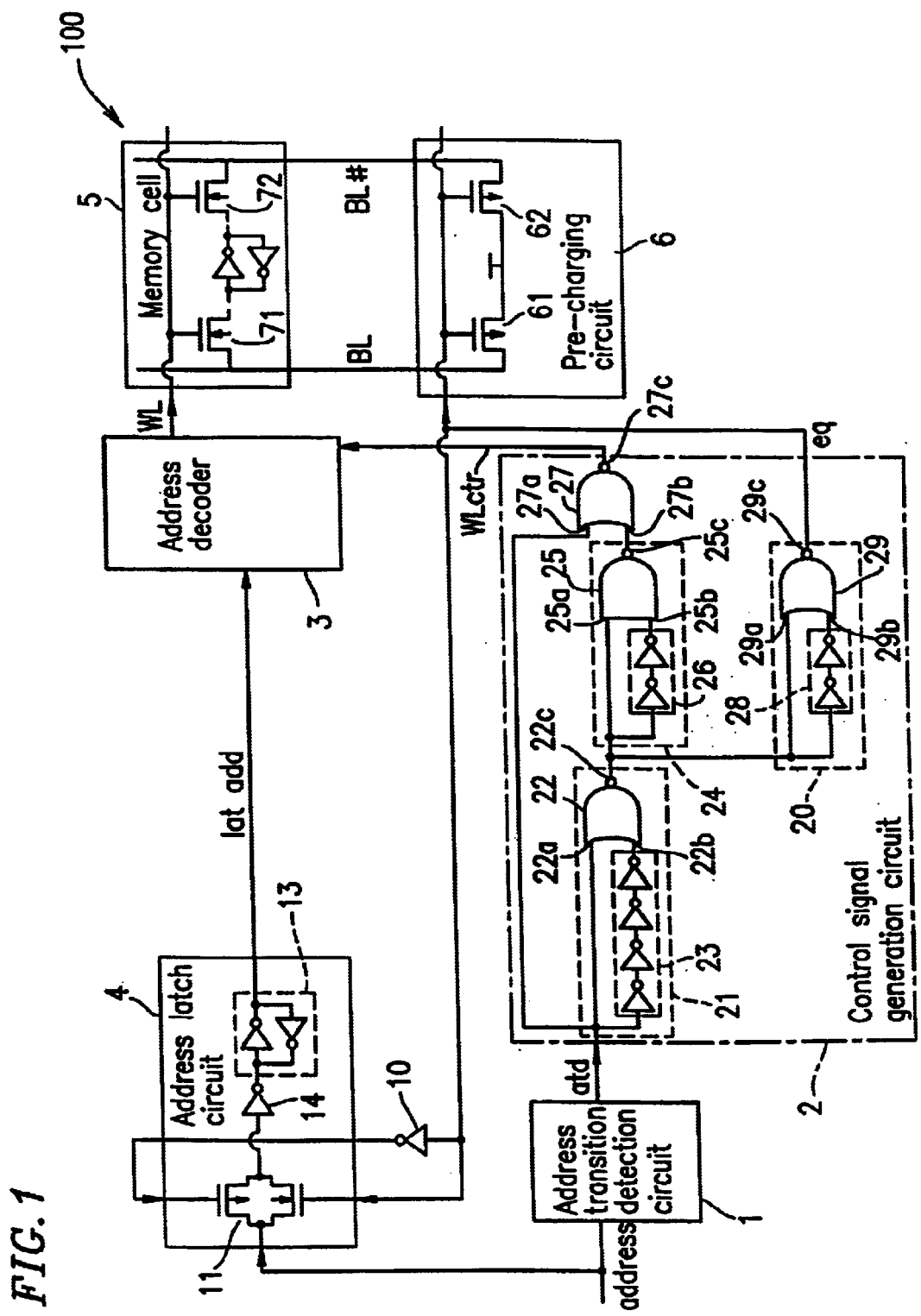
FIG. 1 shows a circuit configuration of an SRAM according to an example of the present invention.

FIG. 1 shows a circuit configuration of an SRAM 100 according to an example of the present invention.

The SRAM 100 includes an address transition detection (ATD) circuit 1 for detecting a state transition of an input address signal address and outputting a pulse signal atd. An output end of the ATD circuit 1 is connected to a control signal generation circuit 2 for generating a decoder activating signal WLctr for controlling activation of an address decoder 3 and generating a bit line pre-charging signal eq for controlling a pre-charging circuit 6. The bit line pre-charging signal eq generated by the control signal generation circuit 2 is input to the pre-charging circuit 6 and an address latch circuit 4. The decoder activating signal WLctr is input to the address decoder 3.

The address latch circuit 4 is controlled by the bit line pre-charging signal eq as follows. The address signal address is input to the address latch circuit 4 for a prescribed time period (while the bit line pre-charging signal eq is at a first logic level), and the input address signal address is output to the address decoder 3. For the remaining time period (while the bit line pre-charging signal eq is at a second logic level), the value of the address signal address which is previously input to the address latch circuit 4 is maintained, and the maintained value of the address signal address is output to the address decoder 3. Activation of the address decoder 3 is controlled by the decoder activating signal WLctr as follows. Among a plurality of word lines WL connected to the address decoder 3, a word line WL corresponding to the value an address signal lat add which is output from the address latch circuit 4 is selected and activated.

The plurality of word lines WL are provided so as to cross a plurality of bit lines BL and a plurality of bit lines BL#. Each of the bit lines BL and each of the bit lines BL# form a pair. Each of the word lines WL and each pair of bit lines BL and BL# are connected to a memory cell 5. Each pair of bit lines BL and BL# transfer data stored in the corresponding memory cell 5.

FIG. 1 shows one word line WL, one pair of bit lines BL and BL#, and one memory cell 5 for simplicity. The SRAM 100 actually includes a plurality of word lines WL, a plurality of pairs of bit lines BL and BL#, and a plurality of memory cells 5. Each memory cell 5 includes two transistors 71 and 72 and two inverters. A gate of each of the transistors 71 and 72 is connected to the corresponding word line WL. A source of the transistor 71 is connected to the corresponding bit line BL, and a drain of the transistor 72 is connected to corresponding bit line BL#. A drain of the transistor 71 and a source of the transistor 72 are connected to each other via the two inverters connected to each other in a loop. The pair of bit lines BL and BL# are connected to the pre-charging circuit 6.

The pre-charging circuit 6 includes two transistors 61 and 62. A gate of each of the transistors 61 and 62 receives the bit line pre-charging signal eq. A source of the transistor 61 is connected to the corresponding bit line BL, and a drain of the transistor 62 is connected to the corresponding bit line BL#. A drain of the transistor 61 is connected to a source of the transistor 62. The pre-charging circuit 6 is controlled by the bit line pre-charging signal eq, and charges the bit lines BL and BL# to a prescribed potential.

Figure 2:
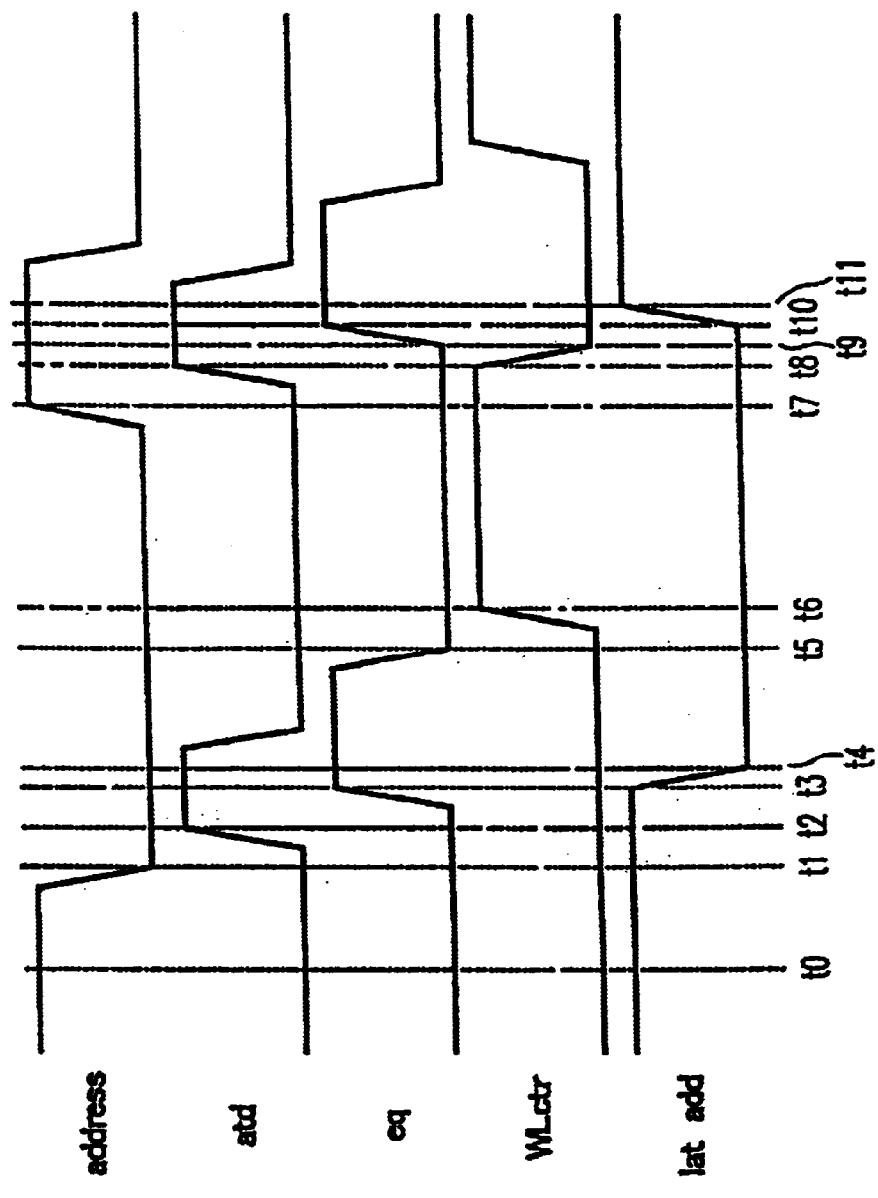
FIG. 2 is a timing diagram illustrating waveforms of signals in the SRAM shown in FIG. 1.

FIG. 2 is a timing diagram illustrating waveforms of signals in the SRAM 100 (FIG. 1).

Figure 4:
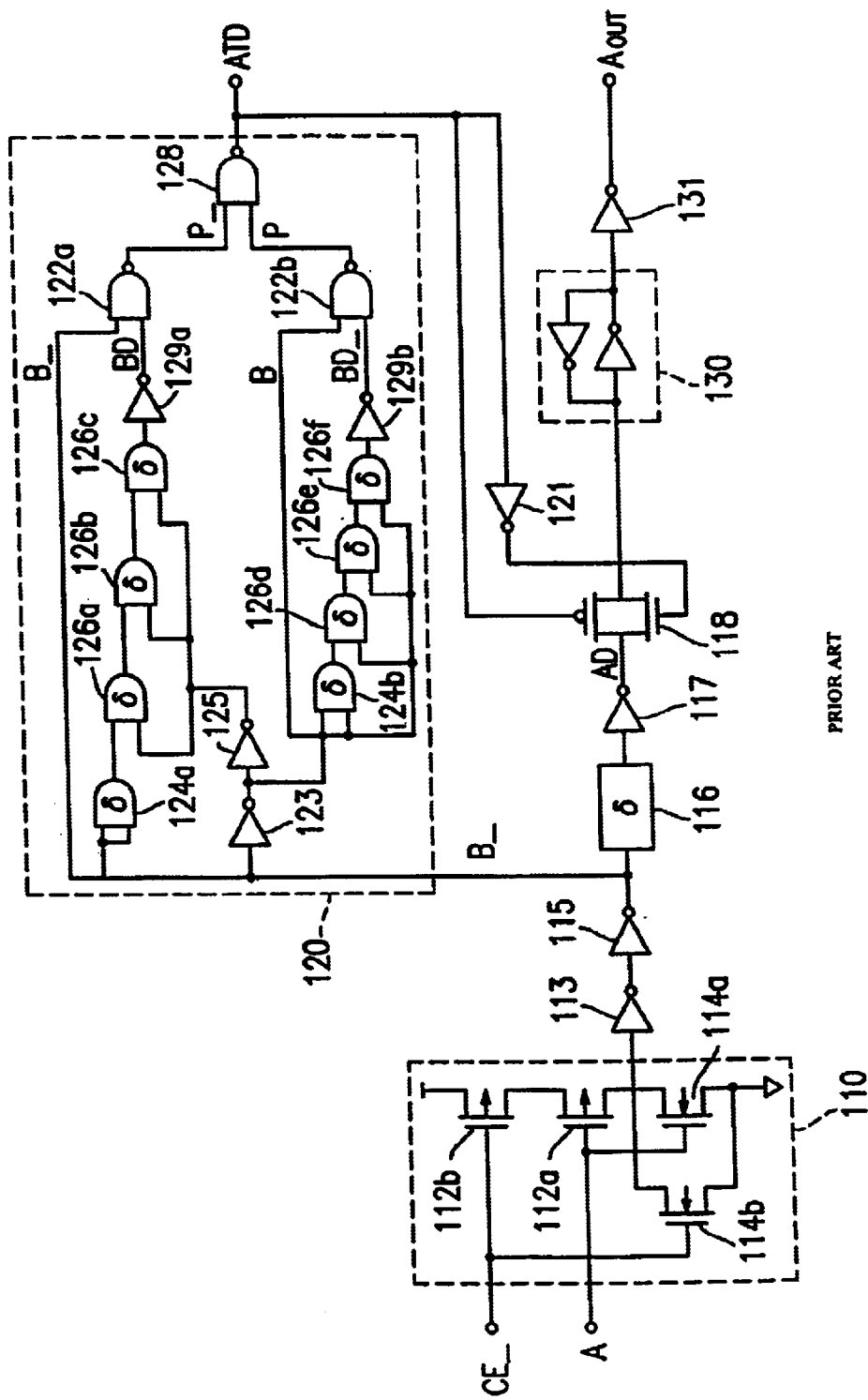
FIG. 4 shows a circuit configuration of a conventional input buffer circuit.
Figure 5:
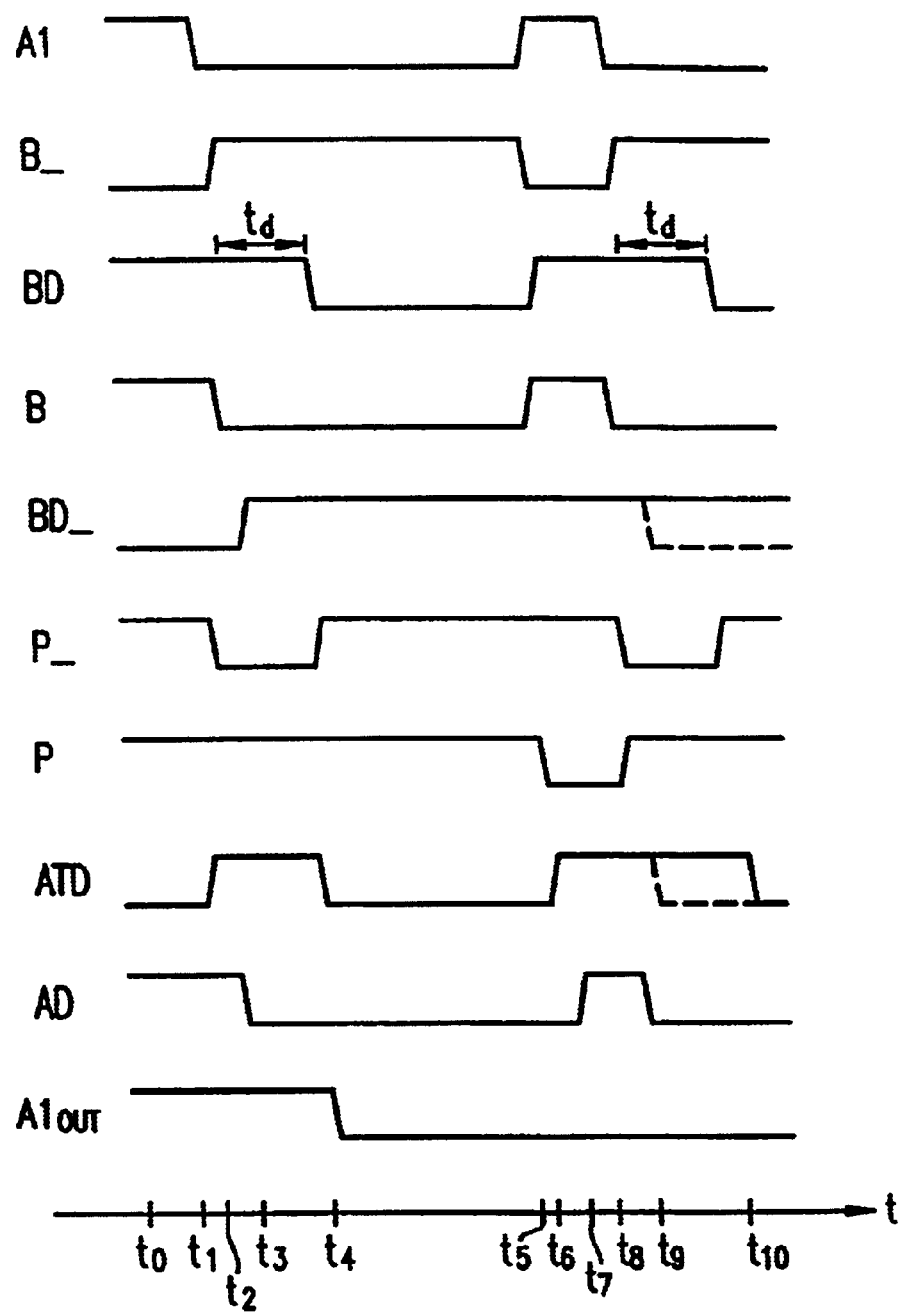
FIG. 5 is a timing diagram illustrating waveforms of signals in the conventional input buffer circuit shown in FIG. 4.

The ATD circuit 1 has a similar structure to that of, for example, the ATD circuit 120 shown in FIG. 4. As shown in FIG. 2, the ATD circuit 1 reacts to both a rising edge and a falling edge of the input address signal address so as to generate a pulse of a prescribed time period. The pulse signal atd output from the ATD circuit 1 is input to the control signal generation circuit 2.

Figure 3:
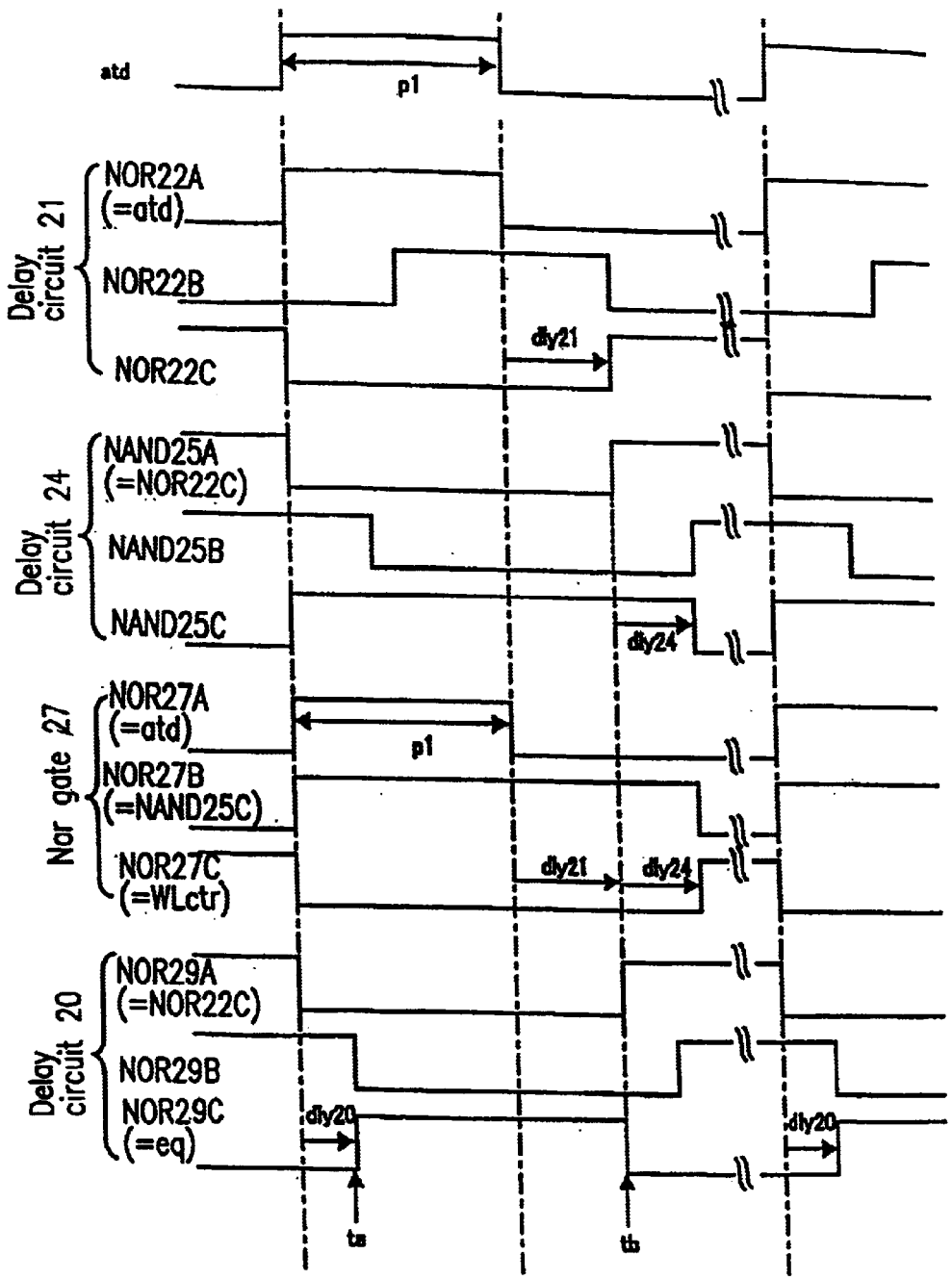
FIG. 3 is a timing diagram illustrating waveforms of signals in a control signal generation circuit of the SRAM shown in FIG. 1.

As shown in FIG. 1, the control signal generation circuit 2 includes a first delay circuit 21, a second delay circuit 24, a third delay circuit 20, and a logic circuit (NOR gate) 27. FIG. 3 is a timing diagram illustrating waveforms of signals in the control signal generation circuit 2.

The pulse signal atd output from the ATD circuit 1 is input to a first input end 22a of a NOR gate 22 of the first delay circuit 21. Therefore, as shown in FIG. 3, when the pulse signal atd (NOR22A) input to the NOR gate 22 from the ATD circuit 1 changes from a LOW logic level to a HIGH logic level, the first delay circuit 21 immediately reacts and outputs a signal NOR22C from an output end 22c of the NOR gate 22. At this point, the signal NOR22C is at a LOW logic level.

The pulse signal atd output from the ATD circuit 1 is delayed by a delay stage 23 including an even number of (four in FIG. 1) inverters and is then input to a second input end 22b of the NOR gate 22 as a signal NOR22B (FIG. 3). Therefore, as shown in FIG. 3, when the pulse signal atd (NOR22A) changes from a HIGH logic level to a LOW logic level, the first delay circuit 21 outputs the signal NOR22C from the output end 22c of the NOR gate 22 after a first delay time period dly21. At this point, the signal NOR22C is at a HIGH logic level. In this manner, the first delay circuit 21 outputs the signal NOR22C having a termination point (rising edge, tb) which is delayed by the first delay time period dly21 with respect to the termination point (falling edge) of the pulse signal atd (end of a time period p1). The signal NOR22C is input to the second delay circuit 24 and the third delay circuit 20.

The signal NOR22C output from the first delay circuit 21 is input to a first input end 25a of a NAND gate 25 of the second delay circuit 24. Therefore, as shown in FIG. 3, when the signal NOR22C (NAND25A) changes from a HIGH logic level to a LOW logic level, the second delay circuit 24 immediately reacts and outputs a signal NAND25C from an output end 25c of the NAND gate 25. At this point, the signal NAND25C is at a HIGH logic level.

The signal NOR22C output from the first delay circuit 21 is delayed by a delay stage 26, in the second delay circuit 24, including an even number of (two in FIG. 1) inverters and then input to a second input end 25b of the NAND gate 25 as a signal NAND25B (FIG. 3). Therefore, as shown in FIG. 3, when the signal NOR22C changes from a LOW logic level to a HIGH logic level, the second delay circuit 24 outputs the signal NAND25C from the output end 25c of the NAND gate 25 after a second delay time period dly24. At this point, the signal NAND25C is at a LOW logic level. In this manner, the second delay circuit 24 outputs the signal NAND25C having a termination point (falling edge) which is delayed by the second delay time period dly24 with respect to the termination point (rising edge, tb) of the signal NOR22C. The signal NAND25C is input to the logic circuit 27.

The signal NOR22C output from the first delay circuit 21 is also input to a first input end 29a of a NOR gate 29 of the third delay circuit 20. Therefore, as shown in FIG. 3, when the signal NOR22C (NOR29A) changes from a LOW logic level to a HIGH logic level (i.e., at time tb), the third delay circuit 20 immediately reacts and outputs a signal NOR29C from an output end 29a of the NOR gate 29. At this point, the signal NOR29C is at a LOW logic level.

The signal NOR22C output from the first delay circuit 21 is delayed by a delay stage 28, in the third delay circuit 20, including an even number of (two in FIG. 1) inverters and then input to a second input end 29b of the NOR gate 29 as a signal NOR29B (FIG. 3). Therefore, as shown in FIG. 3, when the signal NOR22C changes from a HIGH logic level to a LOW logic level, the third delay circuit 20 outputs the signal NOR29C from the output end 29c of the NOR gate 29 after a delay of a third delay time period dly20. At this point, the signal NOR29C is at a HIGH logic level.

As described above, the HIGH logic level signal NOR29C output from the third delay circuit 20 has a logic level inverted from the logic level of the LOW logic level of the signal NOR22C (NOR29A) output from the first delay circuit 21. A starting point (rising edge, ta) of the HIGH logic level pulse of the signal NOR29C is delayed with respect to a starting point (falling edge) of the LOW logic level pulse of the signal NOR22C by the third delay time period dly20. The termination point (tb) of the HIGH logic level pulse of the signal NOR29C is determined by the termination point (rising edge) of the LOW logic level pulse of the signal NOR22C.

The signal NOR29C (which is output as the bit line pre-charging signal eq) from the third delay circuit 20 is input to each of the gates of the transistors 61 and 62 (driving transistors; FIG. 1) of the pre-charging circuit 6. While the signal NOR29C (the bit line pre-charging signal eq) is at a HIGH logic level, the bit lines BL and BL# are pre-charged to the supply voltage Vcc (not shown).

The NOR gate 27 includes a first input end 27a for receiving the pulse signal atd and a second input end 27b for receiving the signal NAND25C output from the second delay circuit 24. A signal NOR27C (FIG. 3) output from an output end 27c of the NOR gate 27 is input to the address decoder 3 as the decoder activating signal WLctr for activating the address decoder 3 and causing the address decoder 3 to select a word line WL. As shown in FIG. 3, while the pulse signal atd is at a LOW logic level (inactive state), the logic level of the decoder activating signal WLctr (NOR27C) is inverted from the logic level of the signal NAND25C output from the second delay circuit 24. While the pulse signal atd is at a HIGH logic level (active state), the logic level of the decoder activating signal WLctr (NOR27C) is at a LOW logic level. Accordingly, during the time period p1 (FIG. 3) in which the pulse signal atd is at a HIGH logic level as a result of a state transition of the input address signal, the word line WL which was selected in the immediately previous access cycle is placed into an inactive state.

In the control signal generation circuit 2, the three delay circuits 21, 24 and 20 have the following functions.

The first delay circuit 21 outputs a signal after a delay of the first delay time period dly21 with respect to the termination point of the pulse signal atd input to the ATD circuit 1. This delay is provided in order to obtain a time period required for a pre-charging operation of a bit line, based on the time period in which the pulse signal atd is at a HIGH logic level (time period p1, FIG. 3). The first delay time period dly21 is set to be a time period which is required for the bit line pre-charging signal eq, generated based on the detection of a transition of the pulse signal atd, to have a prescribed pulse time period (when the bit line pre-charging signal eq is at a HIGH logic level). The pulse time period is equal to or greater than a pre-charging time period required to perform the subsequent access to the memory cells 5.

The second delay circuit 24 outputs a signal after a delay of the second delay time period dly24 with respect to the termination point of the signal output from the first delay circuit 21 (NOR22C). This delay is provided in order to prevent overlapping of the time period in which the bit line pre-charging signal eq (NOR29C) is at a HIGH logic level and the time period in which the word line WL is in an active state. In this manner, the second delay circuit 24 provides a prescribed time period after the bit line pre-charging signal eq becomes LOW before the decoder activating signal WLctr becomes HIGH. The second delay time period dly24 is set to be equal to or greater than a shortest possible time period between the time when the pre-charging operation of the bit line BL and BL# is completed and the time when the activation of the word line WL is started.

The third delay circuit 20 outputs a signal after a delay of the third delay time period dly20 with respect to the starting point of the bit line pre-charging signal eq. This delay is provided in order to prevent overlapping of the bit line pre-charging time period and the time period in which the word line WL is in an active state in the immediately previous access cycle. In this manner, the third delay circuit 20 provides a prescribed time period after a new pulse signal atd is generated as a result of the state transition of the address signal address, and the decoder activating signal WLctr becomes LOW and the word line WL is placed into an inactive state before the bit line pre-charging operation starts. The third delay time period dly20 is set to be equal to or greater than a shortest possible time period between the time when an immediately previous access is terminated and thus the selected word line WL is placed into an inactive state and the time when a pre-charging operation of the bit line is started for a subsequent access in the case where the memory cells are continuously accessed after the address signal is input.

The first delay circuit 21, the second delay circuit 24, the third delay circuit 20 and the logic circuit 27 are timed to operate such that the bit line pre-charging signal eq is activated in the third delay time period after the decoder activating signal WLctr, which is output from the control signal generation circuit 2, is placed into an inactive state, and such that the decoder activating signal WLctr is placed into an inactive state while the pulse signal atd is in an active state.

Referring to FIG. 1, the address latch circuit 4 includes a transfer gate 11, a latch 13 and an inverter 14. The transfer gate 11 includes two transistors which are connected to each other in parallel. A gate of one of the transistors receives the bit line pre-charging signal eq, and a gate of the other transistor receives the inverted bit line pre-charging signal eq via an inverter 10.

An input end of the transfer gate 11 receives the address signal address, and an output end of the transfer gate 11 is connected to an input end of the inverter 14. While the bit line pre-charging signal eq is at HIGH logic level, the input end and the output end of the transfer gate 11 are conductive to each other so as to turn ON the transistors of the transfer gate 11. During that period, the address signal address is supplied to the input end of the inverter 14, and a new value of the address signal address is supplied to an input end of the latch 13. The latch 13 includes two inverters, i.e., a first inverter and a second inverter connected in a loop branch across the first inverter. Thus, an output signal lat add from the latch 13 is obtained by twice inverting the logic level of the address signal address. Therefore, the signal output from the latch 13 has the same logic level of that of the address signal address. Once the bit line pre-charging signal eq becomes LOW, the input end and the output end of the transfer gate 11 are disconnected from each other so as to turn OFF the transistors of the transfer gate 11. Therefore, The value of the address signal address which is input when the bit line pre-charging signal eq becomes LOW is maintained by the latch 13.

An input end of the address decoder 3 receives the signal lat add output from the address latch circuit 4. The signal lat add, which is input to the address decoder 3 while the decoder activating signal WLctr is at HIGH logic level, is decoded, and a word line WL corresponding thereto is selected and activated.

Hereinafter, with reference to FIG. 2, an operation of the SRAM 100 (FIG. 1) in this example will be described.

It is assumed that at time t0 (in an initial state), the address signal address is at a HIGH logic level. This initial state is continued from the immediately previous access cycle and that the previous access cycle started a sufficient time period after the address signal address became HIGH (the state at time t0). All the internal operations of the SRAM 100 are completed in the immediately previous access cycle. Accordingly, the pulse signal atd output from the ATD circuit 1 in the immediately previous access cycle, and the bit line pre-charging signal eq and the decoder activating signal WLctr which are generated based on the pulse signal atd as control signals are all at a LOW level. The signal lat add output from the address latch circuit 4 has the value of the address signal address which is input when the bit line pre-charging signal eq becomes LOW in the immediately previous access cycle. Therefore, the signal lat add is also at a HIGH logic level like the address signal address.

At time t1, the subsequent access to the memory cell is started. The address signal address goes LOW from HIGH. At time t2, in response to this state transition of the address signal address, the pulse signal atd is output from the ATD circuit 1 (i.e., the pulse signal atd is at a HIGH level).

At time t3, in response to the output of the pulse signal atd, the bit line pre-charging signal eq becomes HIGH in the control signal generation circuit 2. In response to this state transition of the bit line pre-charging signal eq, the input end and the output end of the transfer gate 11 become conductive to each other in the address latch circuit 4.

At time t4, the signal lat add output from the address latch circuit 4 becomes LOW, reflecting the value of the post-state transition address signal address.

At time t5, the bit line pre-charging signal eq becomes LOW. Then, the pre-charging operation of the bit line connected to the memory cell 5 is completed. The input end and the output end of the transfer gate 11 are disconnected from each other. Thus, the address latch circuit 4 maintains the value of the address signal address which is input to the address latch circuit 4 at time t5. The maintained value of the address signal address is supplied to the address decoder 3 as the signal lat add.

At time t6, the decoder activating signal WLctr generated in the control signal generation circuit 2 becomes HIGH. While the decoder activating signal WLctr is HIGH, a word line WL is selected and data is read from the memory cell 5 connected to the selected word line WL.

In the case where there is no state transition of the address signal address, the chip enable signal or the like input to the SRAM 100 for a sufficiently long time period after time t5, the internal operation is completed when each signal becomes LOW. Then, the SRAM 100 is returned to the initial state of time t0. In the case where, for example, a state transition of the address signal address occurs immediately after the word line WL is activated and a data read operation from the memory cell is started (e.g., at time t7), the ATD circuit 1 detects the state transition of the address signal address, and at time t8, the pulse signal atd is output.

Performing the next pre-charging operation in the state where the word line WL is active may undesirably destroy the data stored in the memory cell from which the data read operation has already been started. In order to avoid this, each signal needs to be timed such that the pre-charging operation starts after the word line WL is placed into an inactive state with certainty. Namely, a sufficient margin needs to be provided after the word line WL is placed into an inactive state (where the decoder activating signal WLctr is at a LOW logic level) before the pre-charging operation (during which the bit line pre-charging signal eq is active) is started. In this example, the margin is provided by the third delay circuit 20 as the third delay time period dly20.

At time t9, in response to the output of the pulse signal atd, the decoder activating signal WLctr output from the control signal generation circuit 2 becomes inactive, and the read operation in the immediately previous cycle is stopped.

At time t10, the bit line pre-charging signal eq output from the control signal generation circuit 2 becomes HIGH. In response to this, the input end and the output end of the transfer gate 11 become conductive to each other.

At time t11, the signal lat add output from the address latch circuit 4 becomes HIGH, reflecting the post-state transition value of the address signal address.

As described above, according to the present invention, the control signal generation circuit prevents the decoder control signal WLctr and the bit line pre-charging signal eq from being simultaneously activated. This design prevents generation of race conditions between the operation of deactivating the word line WL and the operation of decoding the value of the new address signal address, even when a state transition of the address signal address occurs during the immediately previous access cycle. Therefore, according to the present invention, even when, for example, a state transition of an address signal address occurs immediately after the data read operation from a memory cell is completed, the data stored in the memory cell corresponding to the value of the address signal address can be read without fail.

In addition, according to the present invention, the timing at which the post-state transition address signal address is decoded by the address decoder is synchronized with the timing of an internal operation of the SRAM. This prevents generation of race conditions between the decoding operation of the address and the internal operation. Therefore, no race condition is generated when decoding the address signal address, unlike in the conventional SRAM apparatus using the ATD circuit. It is not necessary to provide an additional delay circuit for adjusting the timings of the control signals. As a result, the necessity of designing a margin for compensating for dispersion in the production process is alleviated, and the influence of the timings on the operating speed of the semiconductor memory device can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a plurality of word lines and a plurality of bit lines arranged so as to cross each other;
   a memory cell provided at each of intersections of the plurality of word lines and the plurality of bit lines and connected to the corresponding word line, among the plurality of word lines, and the corresponding bit line, among the plurality of bit lines;
   an address transition detection circuit for detecting a state transition of an input address signal and generating a transition detection pulse signal;
   an address latch circuit for receiving the address signal and maintaining a value of the address signal;
   an address decoder for decoding the value of the address signal output from the address latch circuit, and selecting a word line corresponding to the value of the address signal among the plurality of word lines, and activating the selected word line;
   a pre-charging circuit for charging a bit line corresponding to the selected word line and the memory cell, among the plurality of bit lines; and
   a control signal generation circuit for receiving the transition detection pulse signal, and generating a decoder activating signal for activating the address decoder and a bit line pre-charging signal for controlling the pre-charging circuit,
   wherein:
      the address latch circuit is controlled by the bit line pre-charging signal, such that while the bit line pre-charging signal is at a first logic level, the address signal is input to the address latch circuit, and while the bit line pre-charging signal is at a second logic level, the input address signal is maintained by the address latch circuit; and
      the address decoder is controlled to be activated by the decoder activating signal; and when the address decoder is activated, the word line corresponding to the value of the address signal input to the address decoder from the address latch circuit is activated, and the memory cell connected to the corresponding word line is accessed.

2. A semiconductor memory device according to claim 1, wherein the control signal generation circuit includes a first delay circuit, a second delay circuit, a third delay circuit, and a logic circuit,
   wherein:
      the first delay circuit receives the transition detection pulse signal, and outputs a signal having a termination point which is delayed with respect to the termination point of the transition detection pulse signal by a first delay time period,
      the second delay circuit receives the transition detection pulse signal, and outputs a signal having a termination point which is delayed with respect to the termination point of the signal output from the first delay circuit by a second delay time period,
      the third delay circuit receives the signal output from the first delay circuit, and outputs a signal, having a starting point which is delayed with respect to the starting point of the signal output from the first delay circuit by a third delay time period, as the bit line pre-charging signal, and
      the logic circuit receives the transition detection pulse signal and also receives the signal output from the second delay circuit, and outputs the signal which is received from the second delay circuit as the decoder activating signal during a time period in which the transition detection pulse signal is in an inactive state.

3. A semiconductor memory device according to claim 2, wherein the first delay circuit, the second delay circuit, the third delay circuit and the logic circuit are timed to operate such that the bit line pre-charging signal is activated in the third delay time period after the decoder activating signal, which is output from the control signal generation circuit, is placed into an inactive state, and such that the decoder activating signal is placed into an inactive state while the transition detection pulse signal is in an active state.

4. A semiconductor memory device according to claim 3, wherein the third delay time period is set to be equal to or greater than a shortest possible time period between the time when an immediately previous access is terminated and thus the selected word line is placed into an inactive state and the time when a pre-charging operation of the bit line is started for a subsequent access in the case where the memory cells are continuously accessed after the address signal is input.

5. A semiconductor memory device according to claim 2, wherein the third delay time period is set to be equal to or greater than a shortest possible time period between the time when an immediately previous access is terminated and thus the selected word line is placed into an inactive state and the time when a pre-charging operation of the bit line is started for a subsequent access in the case where the memory cells are continuously accessed after the address signal is input.

6. A semiconductor memory device according to claim 2, wherein the first delay time period is set to be a time period which is required for the bit line pre-charging signal, generated based on the detection of a transition of the pulse signal, to have a pulse time period which is equal to or greater than a pre-charging time period required to perform the subsequent access to the memory cells.

7. A semiconductor memory device according to claim 2, wherein the second delay time period is set to be equal to or greater than a shortest possible time period between the time when the pre-charging operation of the bit line is completed and the time when the activation of the word line is started.

* * * * *